United States Patent [19]

Bender

[11] Patent Number: 4,485,361
[45] Date of Patent: Nov. 27, 1984

[54] PULSE TRANSFORMER PACKAGE FOR IMPEDANCE MATCHING A LASER DIODE TO A TRANSMISSION LINE

[75] Inventor: Gerald M. Bender, St. Louis, Mo.

[73] Assignee: The United States of America as represented by the Secretary of the Air Force, Washington, D.C.

[21] Appl. No.: 452,604

[22] Filed: Dec. 23, 1982

[51] Int. Cl.³ .............................................. H03H 7/38
[52] U.S. Cl. ......................................... 333/32; 336/82; 336/174
[58] Field of Search ................. 333/119, 24 R, 32, 33, 333/185; 336/82, 174, 175

[56] References Cited

U.S. PATENT DOCUMENTS 4,379,273 4/1983 Bender ............................. 333/33 X
4,431,974 2/1984 Landt ............................... 333/33 X

FOREIGN PATENT DOCUMENTS 125610 9/1980 Japan ...................................... 336/82

*Primary Examiner*—Paul L. Gensler
*Attorney, Agent, or Firm*—Donald J. Singer; Bernard E. Franz

[57] ABSTRACT

A package for matching the characteristic impedance of a transmission line to the impedance of a pulsed semiconductor laser diode so that short duration pulses of light can be produced with a fast repetition rate. The package has a toroidal transformer in a cavity of a main body, with a multiturn primary connected to a transmission line. The laser diode is mounted at the edge of a known sandwich between two thin metal plates separated by an insulating layer. A spacer and metal cover cap are placed over the sandwich, and a screw passing through holes of all the parts is threaded into the main body. The screw passing through the transformer core forms a one-turn secondary. Not only does this allow the matching of the characteristic impedance, but also provides heat sinking for the diode. Assembly with a screw makes the unit easy to fabricate, and to replace the laser diode sandwich.

9 Claims, 4 Drawing Figures

PULSE TRANSFORMER PACKAGE FOR IMPEDANCE MATCHING A LASER DIODE TO A TRANSMISSION LINE

RIGHTS OF THE GOVERNMENT

The invention described herein may be manufactured and used by or for the Government of the United States for all governmental purposes without the payment of any royalty.

RELATED APPLICATION

This application is related to my application Ser. No. 277,074 now U.S. Pat. No. 4,379,273 for a Pulse Transformer Laser Diode Package, which is hereby incorporated by reference.

BACKGROUND OF THE INVENTION

This invention relates to an electron-device housing or package with a pulse transformer, and more particularly to such a package having a laser diode.

There are many applications where it is desired to use a driver circuit with a bipolar or field-effect transistor output stage to drive a high power pulsed semiconductor laser diode. Laser diodes typically operate with an electrical pulse of 4 volts potential, 40 amperes or more current, 50 nanoseconds duration, and a repetition rate of 200,000 pulses per second. The best conventional packages heretofore have had approximately 10 nanohenries inductance in series with 40 milliohms resistance. Therefore 30 volts must be applied to obtain the desired maximum rise time of 20 nanoseconds, neglecting the effects of the lead from the driver to the laser package. High voltage thyristor output stages can be used to drive laser diodes in the conventional packages since they can overcome the inductance with higher voltages. Unfortunately, high pulse repetition rates cannot be achieved with a thyristor output stage.

Examples of laser diode mounting structures and packages include Hacskaylo U.S. Pat. No. 3,946,416, in which inductive reactance and capacitive reactance are balanced to leave only pure resistance in the input to the diode, and one side of the diode is mounted on a heat sink that is electrically connected to the housing. Jennings U.S. Pat. No. 4,161,747 shows a diode laser mounted within a helium refrigerator using a braided copper ground strap for shock isolation while providing a good thermal link to the cold tip. Allen, Jr. et al U.S. Pat. No. 4,315,225 shows an array structure in which each diode is soldered between metal plates for intimate thermal and electrical contact, with an insulated spacer between the plates, to form a sandwich package; and several of them are stacked and driven in series.

Therefore there has been needed a package which efficiently couples a laser diode to a transmission line having greatly differing characteristic impedance while still providing sufficient heat sinking that the laser diode can be operated at high current levels and high repetition rates.

My copending application Ser. No. 277,074 discloses a package for matching the characteristic impedance of a transmission line to the impedance of a pulsed semiconductor laser diode so that short duration pulses of light can be produced with a fast repetition rate. The package mounts the laser diode on the center post of a one turn secondary or a toroidal transformer whose multiturn primary is connected to the transmission line. The center also provides heat sinking for the diode. The package provides very good performance with a fast rise time and low drive voltage, and has several advantages over the prior art. However, the package was difficult to fabricate, and once made it was difficult to replace a burned out diode.

SUMMARY OF THE INVENTION

An object of the invention is to provide a package for an electronic device, such as a laser diode, with a pulse transformer, which package is easier to fabricate, and in which it is easier to replace the electronic device. The principal feature of the invention is that a fastener such as a screw which holds the parts of the housing together also functions as a single turn secondary for the toroidal transformer.

In the structure according to the invention, the sandwich package disclosed in U.S. Pat. No. 4,315,225 is used. The main body of the housing has a recess for the toroidal core with the primary winding. The sandwich package and a cover part are placed over the toroid core with aligned holes. The fastener then passes through the holes of all the parts, including the core.

There are several objects, features, and advantages which are common to this invention and that disclosed in my said copending application as listed therein.

BRIEF DESCRIPTION OF THE DRAWING

FIGS. 2, 3 and 4 are perspective views from photographs, in which:

FIG. 2 shows the main body of the package;

FIG. 3 shows an exploded view, with the toroid core and the line to the primary winding in place in the main body; and FIG. 4 shows the assembled package.

DESCRIPTION OF THE PREFERRED EMBODIMENT

Figure 1:
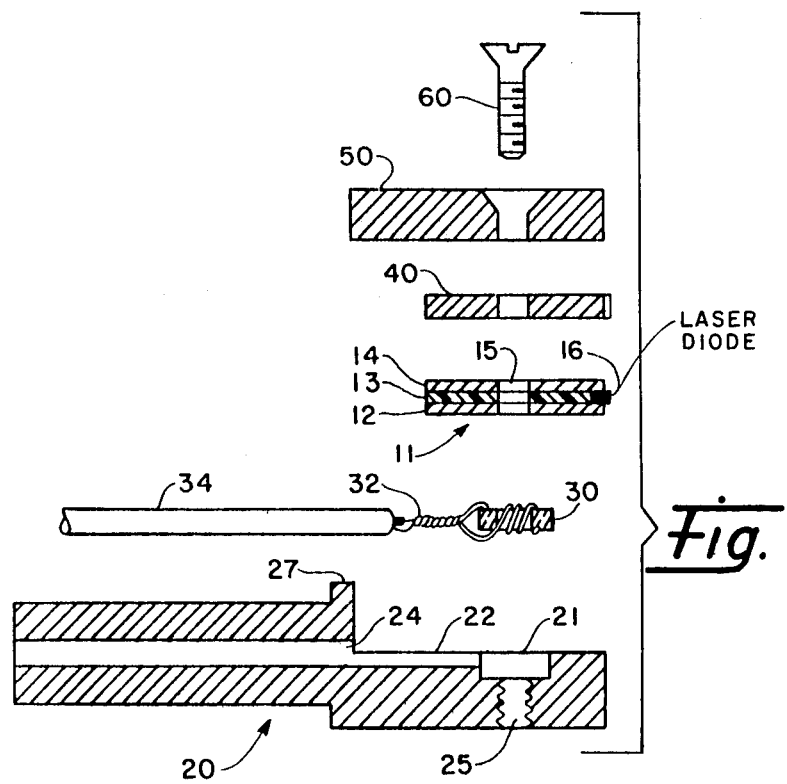
FIG. 1 is an exploded view of the parts of the package in cross section.
Figure 2:
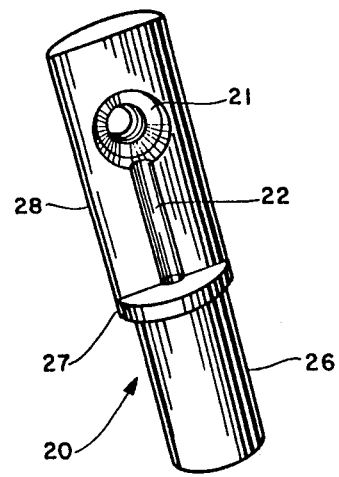

The present invention adapts the pulse transformer package concept covered by my copending application Ser. No. 277,074 with the sandwich package disclosed in U.S. Pat. No. 4,315,225 for laser diodes. It has the advantage of the pulse transformer package—high current together with short pulse width—but does not need to be soldered together into one unit. The pulse transformer package was difficult to fabricate, and once made it was difficult to replace a burned-out diode. The unit according to the present invention has a little more parasitic inductance than the pulse transformer package, hence it is not quite as fast. But the advantage of assembling the unit with a screw and using one of the standard sandwich packages more than offsets the reduced performance, performance which is adequate for the laser diode type LD-65 (40 ampere, 50 nanosecond pulse operating at approximately 3.8–4.5 volts).

Referring to the drawing, the body 20 has a cavity 21 in it to receive a toroidal ferrite magnetic core 30 wound with 24 turns of 36 AWG magnet wire to form the transformer primary winding. The two ends of the wire from the primary winding are twisted together to form a twisted pair 32 with 50 ohms characteristic impedance. Twisted pair 32 is connected to a coaxial cable 34 which is also of 50 ohms characteristic impedance. The twisted pair 32 and coaxial cable 34 fit in the channel 22 and hole 24 respectively of the body 20. The laser diode 16 is in the sandwich package 11. This, together with spacer 40 and copper cap 50, are assembled to the copper body 20 with a screw 60 which is threaded into a tapped hole 25 of the body 20.

Figure 3:
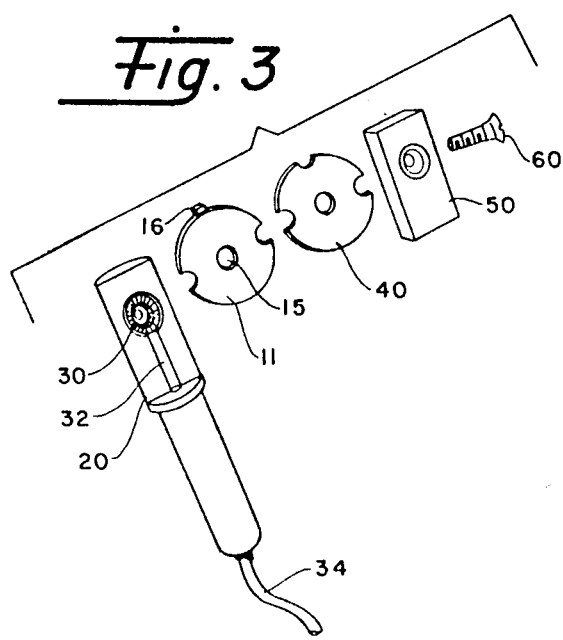
Figure 4:
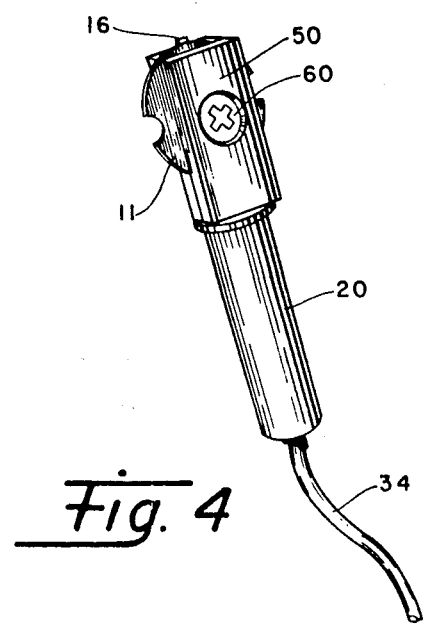

The sandwich package is described in detail in U.S. Pat. No. 4,315,225 for a Heat Sink Laser Diode Array, and also in papers in SPIE Vol. 247 by L. B. Allen, Jr. et al (published 1980 by the Society of Photo-Optical Instrumentation Engineers, Box 10, Bellinghamd, Wa 98227 USA). The patent and papers are hereby incorporated by reference. The thickness of the sandwich 11 and spacer 40 are greatly exaggerated in FIG. 1, since they typically may have a diameter of approximately 16 millimeters, and their combined thickness may be approximately one fourth millimeter, as made for stacking in an array. The sandwich 11 comprises two metal plates 12 and 14 with an insulation layer 13 between them. The laser diode 16 is mounted between the metal plates at one edge and soldered to them. The metal plates 12, 14 may be copper plated with gold, and function both as heat sinks and electrical conductors. The center hole 15 is for passage of a fastener to hold an assembly together, the other two holes (FIG. 3) are used for air cooling in array use, and the two edge cutouts are used for alignment in array assembly. In array use, a spacer plate made from a soft metal is used between the double-sided heat sink sandwiches. This plate is generally of the same shape as the sandwich except that a relief cutout is provided in the diode area. The spacer plate 40 is also used herein to provide diode relief.

The body 20 and cover cap 50 may be made of copper with gold plating. The body 20 has one portion 26 cylindrical with the hole 24 bored along its axis. The portion 28 having cavity 21 and channel 22 is semicylindrical with a larger diameter. A shoulder 27 between the two portions is cylindrical with the same diameter as the portion 28.

Electrically, the circuit is the same as that shown in my copending patent application. The toroidal transformer has a multiturn primary winding coupled to a driver circuit via a 50-ohm transmission line. A massive one-turn secondary is connected to the laser diode, and also functions as a heat sink. The electrical path of the secondary may be traced from one terminal of the diode through plate 14 of the sandwich 11, spacer 40 and cover cap 50, the screw 60, body 20, and the plate 12 of the sandwich to the other terminal of the diode. The screw passes through the ferrite core, hence the electromotive force of the transformer causes a voltage difference across the ends of the screw 60. This voltage is applied across the diode.

Thus, while preferred constructional features of the invention are embodied in the structure illustrated herein, it is to be understood that changes and variations may be made by the skilled in the art without departing from the spirit and scope of my invention.

I claim:

1. Apparatus for packaging an electronic device having at least two terminals and matching its impedance to the impedance of a transmission line, said apparatus comprising:
    a body of electrically conductive material having a surface in which a cavity is formed;
    a toroidal transformer positioned in said cavity having a primary winding thereabout and means for connecting said primary winding to the transmission line;
    a cover of electrically conductive material;
    center conductor means extending from said body through said toroidal transformer;
    mounting means for said electronic device such that an electrical path which includes said body, said center conductor means and said cover is connected to said two terminals to form a one turn secondary for the toroidal transformer, driving the electronic device;
    wherein said body includes a hole generally centered below said cavity, said cover has a hole through it, and said center conductor means is a fastening means passing through the hole of the cover, the toroidal transformer, and the hole of the body to fasten the apparatus together.

2. Apparatus according to claim 1, wherein said mounting means includes a sandwich comprising two plates of conductive material with an insulating spacer means between them, there being an area between the plates cutout of the insulation spacer means in which the electronic device is located with a terminal connected to each plate, there being a central hole through the sandwich, the sandwich being placed between said surface and said cover with said fastening means passing through the hole of the sandwich.

3. Apparatus according to claim 2, wherein said electronic device is a laser diode having its terminals soldered to said plates.

4. Apparatus according to claim 3, which further includes a spacer of electrically conductive material between said sandwich and said cover with a hole for said fastening means.

5. Apparatus according to claim 4, wherein said hole below the cavity in said body is tapped, and said fastening means is a screw threaded into the tapped hole.

6. Apparatus according to claim 5, wherein said transmission line is a coaxial cable connected to the primary winding via a twisted pair, with a single length of insulated wire forming the primary winding and the twisted pair.

7. Apparatus according to claim 6, wherein said body comprises one portion having said surface, and another portion having an axial hole through it through which the coaxial cable passes, and said surface has a channel extending from the cavity to the axial hole, with the twisted pair placed in the channel.

8. Apparatus according to claim 7, wherein the cover has a side generally the same size and shape as said surface, the cover being placed to align with the surface.

9. Apparatus according to claim 1, wherein said hole below the cavity in said body is tapped, and said fastening means is a screw threaded into the tapped hole.

* * * * *